United States Patent [19]

Murai et al.

[11] Patent Number: 5,302,424
[45] Date of Patent: Apr. 12, 1994

[54] METHOD FOR FORMING A FILM WITH PLASMA CVD PROCESS

[75] Inventors: Mikio Murai, Hirakata; Kiyoshi Takahashi, Ibaragi; Masaru Odagiri, Kawanishi; Hideyuki Ueda, Takatsuki, all of Japan

[73] Assignee: Matsushita Electric Industrial Co., Ltd., Osaka, Japan

[21] Appl. No.: 913,189

[22] Filed: Jul. 14, 1992

[30] Foreign Application Priority Data

Jul. 15, 1991 [JP] Japan ................... 3-173613

[51] Int. Cl.⁵ .......................................... C23C 16/00
[52] U.S. Cl. ...................... 427/131; 427/569; 427/132; 427/249; 427/577
[58] Field of Search ............... 427/569, 577, 131, 132, 427/249; 118/723

[56] References Cited

U.S. PATENT DOCUMENTS 4,555,464 11/1985 Kido et al. ........................ 427/74
5,182,132 1/1993 Murai et al. ..................... 427/577

Primary Examiner—Shrive Beck
Assistant Examiner—David M. Maiorana
Attorney, Agent, or Firm—Wenderoth, Lind & Ponack

[57] ABSTRACT

In plasma discharge to form a film on a magnetic tape of the like in a plasma CVD process, a hollow electrode 12 is arranged in a discharge tube 8 or arranged opposed to another electrode 34. A non-polymerizable gas is blown out from the inside of the hollow electrode 12 made from a sintered alloy, and impurities do not adhere to the electrode. Then, small traces of discharge are not generated on the magnetic tape and impurities do not contaminate the magnetic tape, so that a uniform thin film of high quality is manufactured at a high rate in an industrial scale.

18 Claims, 4 Drawing Sheets time

METHOD FOR FORMING A FILM WITH PLASMA CVD PROCESS

BACKGROUND OF THE INVENTION

1. Field of the Invention

The present invention relates to a plasma chemical vapor deposition (CVD) process which is used for example to form a protection film of a magnetic recording medium of thin film type or a superconductor film and an amorphous silicon film for a solar cell.

2. Description of the Prior Art

A thin film is produced by a plasma CVD film-deposition process which has been used in many fields.

In the fields of semiconductor and liquid crystal, such a film has been developed as a protection film. For example, a $SiO_2$ film is used as an insulator film of an LSI. On the other hand, in the field of magnetic recording medium of thin film type, a diamond-like carbon film or a carbon film is used to improve the reliability of a magnetic disk or a deposition tape. Further, in the field of solar cells an amorphous silicon film is used practically for a solar cell. The amorphous silicon film is manufactured with a plasma CVD process.

However, from the aspect of industrial application, it is a problem that the electrode used in the plasma CVD process has to be cleaned often because it becomes dirty after long term plasma discharge. It is a more serious problem that a substance dropped from the dirty electrode makes the plasma discharge unstable and that it is included into the growing film.

For example, in the field of magnetic recording medium, manufacturing methods have been developed to balance the productivity and the reliability of a diamond-like carbon film, as disclosed in Japanese patent application Nos. 321698/1989 and 286197/1990 which describe means to solve the anomalous discharge phenomenon accompanied with a large excess current and the improvement of productivity.

However, it has been recognized now that a brown to black substance adheres to the electrode in the discharge tube and to the inner wall of the discharge tube after long time discharge. The substance peels off to affect the plasma discharge badly and the resultant magnetic tape has small traces of discharge thereon. Especially, this phenomenon is remarkable when a hydrocarbon gas having a large number of carbon atoms and having double bonds is used. Thus, though the film-deposition rate increases to 20 nm/s and the reliability of magnetic tape becomes sufficient, the stability of the production remains as a problem.

Further, in a plasma CVD process with use of opposite electrodes of the capacitor coupling type, a diamond-like carbon film and an amorphous film as a protection film of magnetic disk are manufactured. In this process, the electrode in the side where no substrate is put becomes dirty after a long discharge time, the deposit to the electrode penetrates into the film. This is a cause of the scattering of the film quality of diamond-like carbon film and the conversion efficiency of solar cell.

SUMMARY OF THE INVENTION

It is an object of the present invention to solve the degradation of the film quality due to the dirt of the electrode in a plasma discharge deposition film such as a $SiO_2$ protection film for semiconductors and liquid crystals so as to be able to manufacture the thin film in an industrial scale.

It is another object of the present invention to solve the degradation of products due to the dirt of the inner wall of the discharge tube caused by long time plasma discharge.

When a protection film of magnetic recording medium, an amorphous silicon film, a $SiO_2$ protection film or a superconductor film is deposited for a long time in the plasma CVD process, it is desirable to prevent an undesirable substance from disturbing the plasma discharge or to prevent the inclusion of such substance to be adhered to the electrode or the inner wall of the discharge tube. In a plasma discharge apparatus wherein an electrode is arranged in a discharge tube, the electrode arranged in the opposite side of the substrate or the thin film is made of sintered alloy having a number of holes of 10–50 $\mu$m in diameter or metal having narrow holes of about 500–50 $\mu$m in diameter. A thin film is formed by the plasma CVD process while only non-polymerizable gas is blown out from the electrode which is connected electrically to the ground. (The "non-polymerizable gas" denotes a gas which does not react with the polymerizable gas at the surface of the electrode, though it may react with the polymerizable gas in the discharge region.) Because only non-polymerizable gas is blown from the surface of the electrode, no substance adheres to the surface of the electrode, so that the stability of the plasma discharge and the homogeneity of the grown film can be assured. In a method, only the inner wall of the discharge tube is made from porous insulator, and a thin film is formed while only non-polymerizable gas is blown to the inside of the discharge tube, so that the dirtiness of the inner wall of the discharge tube is prevented. Thus, the inclusion of impurities in a thin film or the instability of discharge due to impurities are prevented, and a thin film of uniform film quality can be manufactured in an industrial scale.

In a plasma discharge apparatus, wherein two electrodes are arranged opposite to each other, one of the electrodes comprises a porous inner wall. A substrate is connected to the other electrode. An inert gas is blown out through the porous inner wall to the discharge region between the two electrodes, while a polymerizable gas is introduced from another inlet to the discharge region. Thus, similarly to the above-mentioned method, the inclusion of impurities in a thin film or the instability of discharge due to impurities are prevented, and a thin film of uniform film quality can be manufactured in an industrial scale.

An advantage of the present invention is that a diamond-like carbon film as a protection film of magnetic recording medium can be deposited at a rate of 25 nm/s or more for a long time without traces of discharges on a tape or the like so that the magnetic recording medium of thin film type of high output and high reliability can be manufactured in an industrial scale.

Another advantage of the present invention is that the film quality of diamond-like carbon film on a magnetic disk is improved and that the contact start stop characteristics of magnetic disks can be improved eventually.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Embodiment 1

Figure 1:
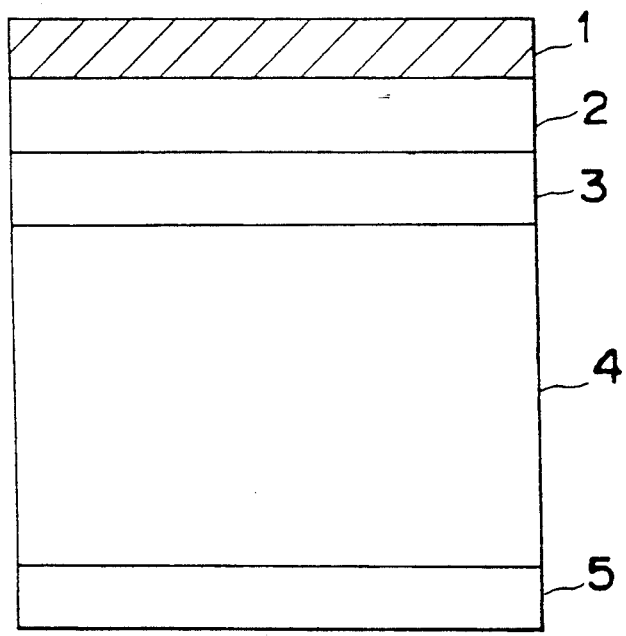
FIG. 1 is a schematic sectional view of magnetic tape of metallic thin film.

Referring now to the drawings, first, a magnetic tape of thin film type is explained as an example in the field of magnetic recording medium. FIG. 1 shows a schematic sectional view of a magnetic tape of metallic thin film type. The structure of the magnetic tape is explained. The reference numeral 1 denotes a lubricant layer made mainly from a carboxylic acid including fluorine atoms and its thickness is 3-5 nm. It may be made from only the carboxylic acid or a carboxylic acid ester including fluorine atoms. For example, it includes $C_5F_{11}(CH_2)_{10}COOH$ or $C_5F_{11}(CH_2)_{10}COOC_8H_{17}$.

The reference numeral 2 denotes a diamond-like carbon film which has Vickers hardness of about 3000 so as to prevent damage of magnetic tape together with the lubricant. Its thickness is preferably 10-20 nm in order to balance reliability and output.

The reference numeral 3 denotes a thin film of ferromagnetic metal of for example Co—Ni—O, Co—O or Co—Cr. Its thickness is generally 50-300 nm.

The reference numeral 4 denotes a nonmagnetic substrate of a film of polyethylene terephthalate. It may be made of polyethylene naphthalate, polyamide, polyimide or the like. It is preferable that the surface on the magnetic side of the tape has protrusions of 10-30 nm in order to reconcile the reliability and the output.

The reference numeral 5 designates a back coating layer made from polyurethane, nitrocellulose, polyester and carbon, and calcium carbonate. Its thickness is 500 nm.

Figure 2:
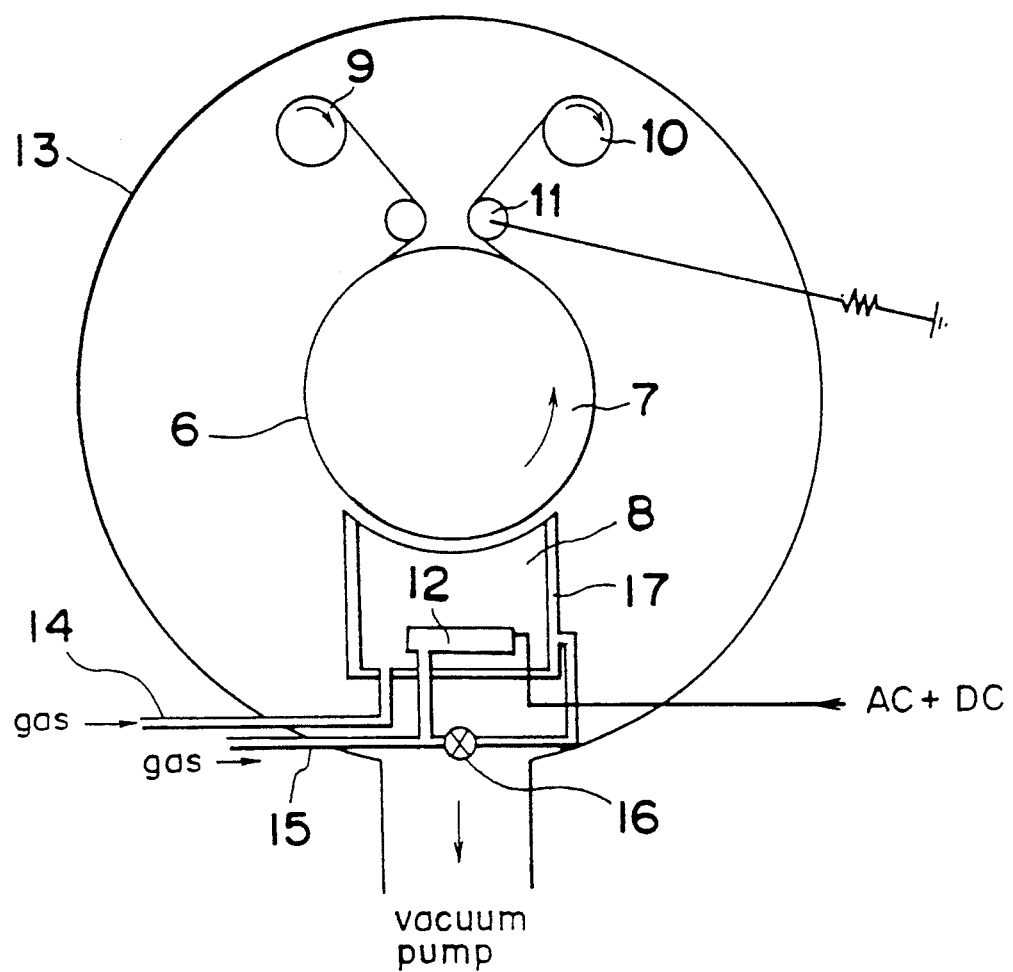
FIG. 2 is a schematic diagram of an apparatus for forming a protection film with a plasma CVD process of an embodiment of the present invention.

FIG. 2 shows an example of an apparatus for forming a magnetic recording medium 6, wherein the reference numeral 13 denotes a vacuum chamber which is controlled to have a pressure of $10^{-4}$ - $10^{-3}$ Torr. It is evacuated from the evacuation outlet with a vacuum pump (not shown).

The reference numeral 7 denotes a can with which a magnetic tape 6 of metallic thin film contacts. As to the magnetic tape 6, the metallic thin film 3 is arranged at the outside with reference to the can 7 and the diamond-like carbon film 2 is deposited on the tape 6 in a plasma discharge area. Water circulates in the inside of the can 7 in order to cool the magnetic tape 6.

The reference numeral 9 denotes a feeder of the magnetic tape 6, while the reference numeral 10 denotes a winder of the magnetic tape 6.

The reference numeral 11 denotes a roll and it also guides the electric current flowing in a discharge tube 8 via the metallic thin film 3 to the ground. The roll 11 is made for example from a semiconductor material such as SiC, whose resistance is controlled so as not to give damages due to heating to the substrate 4 of polyethylene terephthalate (PET).

The reference numeral 8 denotes the discharge tube for depositing a diamond-like carbon film 2 on the magnetic tape 6. A pressure difference is generated between the discharge tube 8 and the can 7 for plasma discharge. The discharge tube 8 consists of inner and outer walls. A gas can be introduced via a pipe 14 inside the discharge tube 8 directly, while another gas can be introduced via a pipe 15 and a valve 16 to a space 17 provided between the two walls. Generally, the outer wall of the discharge tube 8 is made from a heat-resistant polymer material, and the inner wall is made of a porous material of Teflon. Thus, in the apparatus shown in FIG. 2, the another gas can also be blown out to the inside of the discharge tube 8 through the porous inner wall to the inside of the discharge tube 8 if the valve 16 is opened. If it is not needed to introduce gas through the porous inner wall, the discharge tube is made only from a heat-resistant polymer material. As will be explained later, according to a method of the present invention, hydrocarbon (polymerizable gas) is introduced through the pipe 14 to the inside of the discharge tube 8, while an inert gas (non-polymerizable gas) is introduced through the pipe 15 and the electrode 12 to the inside of the discharge tube 8. According to another method, inert gas is also introduced through the space 17 of the discharge tube 8.

A pipe-like electrode 12 made of sintered alloy of stainless steel (SUS 316) is provided inside the discharge tube 8 in order to introduce gas, and an AC and/or DC electric voltage is applied to the discharge tube 12. Only inert gas is introduced to the electrode 12 in this invention. The gas spreads through the pores of about 10 $\mu$m diameter of the hollow electrode 12 into the discharge tube 8. Though the electrode 12 is made from a sintered alloy of stainless steel in this embodiment, the material may be any sintered material having narrow holes. Further, the electrode 12 may be a pipelike electrode of metal having narrow holes of 500-50 $\mu$m of diameter produced mechanically.

The film-deposition in this embodiment is explained below with reference to manufacturing conditions.

The nonmagnetic substrate 4 of 500 mm width of polyethylene terephthalate has $10^5$-$10^9$/cm$^2$ of protrusions of 30 nm height, 200 nm diameter on the surface detected by the scanning tunneling microscope (STM) analysis. A thin film 3 of ferromagnetic metal of Co(80)—Ni(20) is formed up to a thickness of 160 nm on the substrate 4 by introducing oxygen in the oblique vacuum deposition process. Then, a back coating layer 6 is formed up to 500 nm thickness on the other side of the substrate 4 by applying a methyl ketone/toluene/anone solution including 30% of solid of polyurethane, nitrocellulose and carbon black with a reverse roll coater.

Then, the tape is set in the apparatus shown in FIG. 2, and a diamond-like carbon film 2 of the magnetic tape 6 is deposited on the tape. 800 V of AC current and +1000 V of DC current are superposed and applied to the pipe-like electrode 12. The inner pressure of the discharge tube 8 is set to be 0.10-0.30 Torr, while that of the vacuum chamber 13 is 0.001 Torr or less. If the pressure in the vacuum chamber increases more than this value, the discharge starts even in the vacuum chamber. The pressure difference is controlled by a space between the discharge tube 8 and the can 7. The composition ratio of inert gas to hydrocarbon is set to be 1:3 in pressure ratio. The inert gas is for example argon or neon, while the hydrocarbon is for example toluene, methane, propane and benzene.

Samples Nos. 1-13 are produced by changing the introduction conditions because the introduction of inert gas and hydrocarbon to the discharge tube 8 and to the electrode 12 affect the stability of long-term film deposition of the diamond-like carbon film 2.

As to Samples Nos. 1-4 according to the present invention, only inert gas is introduced through the electrode 12 while hydrocarbon is introduced in the discharge tube 8.

As to Samples Nos. 5, 6, both inert gas and hydrocarbon are introduced through the electrode 12. As to Samples Nos. 7-9, both inert gas and hydrocarbon are introduced in the discharge tube 8. As to Samples Nos. 10, 11, hydrocarbon is introduced through the electrode 12, while inert gas is introduced through the discharge tube 8.

As to Samples Nos. 12, 13 according to the present invention, inert gas is introduced through the electrode 12 and through the inner wall of the discharge tube 8 while hydrocarbon is introduced in the discharge tube 8. The ratio of the gas blown through the electrode 12 to that introduced in the discharge tube 12 is controlled by the valve 16 to be about 2:1.

The feed speed of the tape 6 is adjusted between about 3 and 300 m/min according to the deposition rate.

Table 1 compiles the conditions of the introduction of gas and the kind of gas. Table 1 also compiles the number of small discharge traces of 2-3 mm in diameter observed on the tape when the diamond-like carbon film 2 of 3000 m long is formed and the deposition rate of the diamond-like carbon film 2.

TABLE 1

| | diamond-like carbon film of magnetic tape | | | |
|---|---|---|---|---|
| Sample No. | inner pressure in DT (Torr) | gas introduction conditions | rate of discharge traces (/3000 m) | deposition rate (nm/s) |
| 1 | 0.30 | argon: inside EL toluene: inside DT | 0 | 30 |
| 2 | 0.20 | argon: inside EL methane: inside DT | 0 | 2 |
| 3 | 0.25 | argon: inside EL propane: inside DT | 0 | 7 |
| 4 | 0.25 | neon: inside EL benzene: inside DT | 0 | 26 |
| 5 | 0.20 | neon: inside EL benzene: inside EL | 12-22 | 22 |
| 6 | 0.20 | argon: inside EL toluene: inside EL | 8-17 | 6 |
| 7 | 0.25 | argon: inside DT methane: inside DT | 10-20 | 26 |
| 8 | 0.30 | argon: inside DT methane: inside DT | 3-5 | 3 |
| 9 | 0.30 | neon: inside DT benzene: inside DT | 12-25 | 31 |
| 10 | 0.30 | argon: inside DT methane: inside EL | 10-20 | 30 |
| 11 | 0.20 | argon: inside DT propane: inside EL | 5-10 | 7 |
| 12 | 0.30 | argon: inside EL and inside the inner space of DT propane: inside DT | 0 | 8 |
| 13 | 0.20 | neon: inside EL and inside the inner space of DT benzene: inside DT | 0 | 28 |

NB: "EL" denotes the electrode 12, and "DT" denotes the discharge tube 8.

Figure 3:
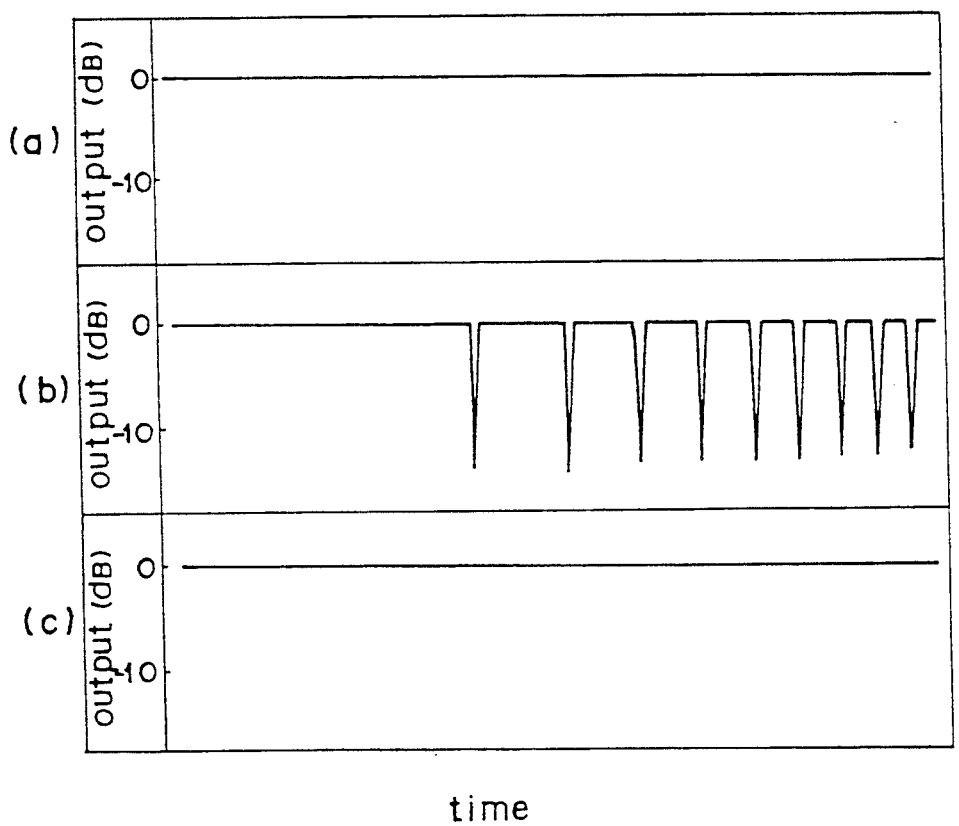
FIG. 3 is a graph for showing the stability of the output of representative samples: (a) sample No. 1, (b) sample No. 7 and (c) sample No. 12.

A lubricant $C_5F_{11}(CH_2)_{10}COOH$ dissolved in a solvent is applied with a coater to the diamond-like carbon films 2 of Sample Nos. 1-13 obtained above, to apply a lubricant layer 1 of a thickness which becomes 3 nm after the drying. Next, Samples Nos. 1-13 are provided for evaluation after cutting by a slitter to give an 8 mm width. The stability of the output in the longitudinal direction of these Samples is examined with an 8 mm video cassette recorder. The output is measured in the longitudinal direction on twenty rolls of 120 minute tapes. FIG. 3 shows the results of Sample No. 1 (this invention), Sample No. 7 and Sample No. 12 (this invention) as representative examples.

The data of Table 1 and FIG. 3 show that even if hydrocarbon gas having a large number of carbons and including many double bonds such as benzene or toluene is used, discharge traces due to the adhesion of soot are not generated when a sintered alloy is used as the electrode 12 and inert gas such as argon or neon is blown out. That is, the resultant magnetic recording medium of thin film type has no disturbance of the output, as shown in (a) and (c) in FIG. 3. On the contrary, an shown in (c) in FIG. 3, the comparison sample No. 7 shows drops in output at the position of discharge traces.

It is also found preferable that the inert gas is also blown out from the inner wall of the electrode 12 and the discharge tube 8, as in Samples Nos. 12 and 13.

On the contrary, if polymerizable hydrocarbon gas is introduced in the electrode 12 (Samples Nos. 5 and 6) or if inert gas and hydrocarbon are introduced in the discharge tube 8 besides the electrode 12 (Samples Nos. 7-10), a soot substance adheres to the surface of the electrode 12 in a long-term discharge, and it peels off so that the discharge becomes unstable, and small discharge traces remain on the resultant thin film tape. Thus, the output is lowered.

However, when the amount of hydrocarbon as polymerizable gas is relatively small, for example when argon:benzene = 1:1, even if both gases are introduced through the sintered alloy electrode 12, the surface of the electrode does not become so dirty, and large damages are not observed.

Thus, when a magnetic recording medium is manufactured, a diamond-like carbon film as a protection film can be deposited at a rate of 25 nm/s or more for a long time without adhering substances to the electrode and the inside wall of the discharge tube and without traces of discharges on the tape.

EMBODIMENT 2

Next, an embodiment of diamond-like carbon film as an example of a protection film for a magnetic disk will be explained.

Figure 4:
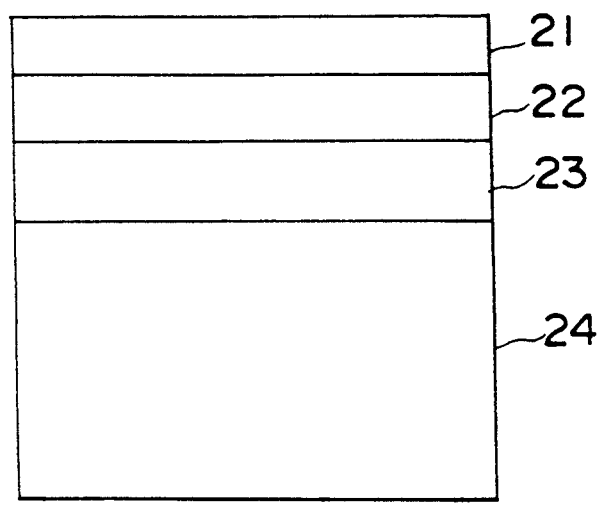
FIG. 4 is a schematic sectional view of a magnetic disk.

FIG. 4 shows a schematic sectional view of a magnetic disk. The reference numeral 21 denotes a lubricant layer including mainly a carboxylic acid including fluorine atoms such as $C_5F_{11}(CH_2)COOH$, and its thickness is 2-5 nm.

The reference numeral 22 denotes a diamond-like carbon film deposited according to a manufacturing method of the present invention. The Vickers hardness of the film is as hard as about 3000, and this prevents damages of the disk together with the lubricant layer 21. It is preferable that the thickness is 10-50 nm in order to balance the reliability and the output.

The reference numeral 23 is a thin film of ferromagnetic metal, and it is subjected to surface treatment if necessary. The material of the thin film is for example Co—Ni, Co—Ni—Cr, Co—Cr or Co—Pt—B.

The reference numeral 24 is a nonmagnetic substrate which is made from for example glass, aluminum alloy or polycarbonate. It is preferable that the surface of the magnetic plane side of the substrate is processed to have protrusions of 10-30 nm in order to make compatible the reliability and the output.

Figure 5:
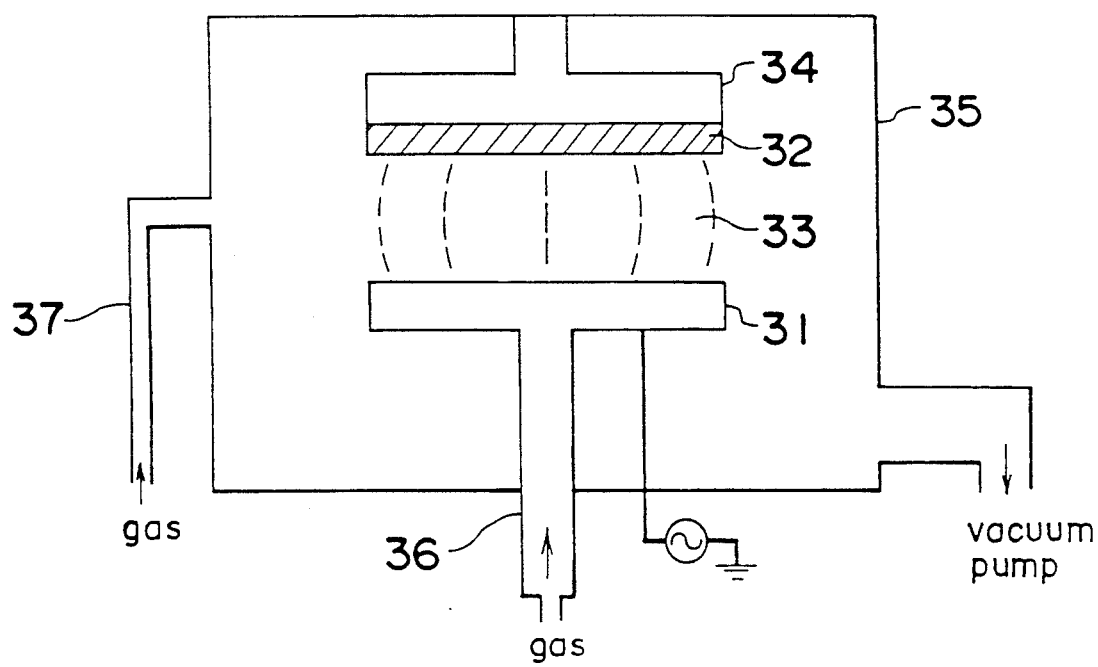
FIG. 5 a schematic sectional view of an apparatus for forming a protection film with a plasma CVD process of an embodiment of the present invention.

FIG. 5 shows a schematic sectional view of an apparatus of opposite electrodes type for forming a diamond-like carbon film 23 as a protection film of a magnetic disk 32, an amorphous silicon film or a superconductor thin film on a rigid substrate. When an amorphous silicon film or a superconductor thin film is formed on a flexible substrate, an apparatus shown in FIG. 2 is used.

The reference numeral 31 denotes an electrode of pipe-like sintered alloy of stainless steel (SUS 316), and only inert gas is introduced to the electrode 31 via a pipe 36. The gas diffuses through the holes of about 10 $\mu$m to the glow discharge region 33. The material of the electrode 31 may be other sintered alloys having narrow holes or the electrode may be made of a metal providing holes of 500-50 $\mu$m mechanically.

The reference numeral 32 denotes a magnetic disk to which a magnetic thin film 23 is applied. It is fixed to an electrode 34 when the film is deposited. After a diamond-like carbon film 23 is formed on one surface, another diamond-like carbon film is formed also on the other surface of the magnetic disk. The reference numeral 35 denotes a vacuum chamber, which is evacuated with a vacuum pump (not shown) and is controlled to have a pressure of 0.5-0.01 Torr. Then, the discharge is performed. A gas is introduced into the vacuum chamber via a pipe 37.

In this embodiment, a batch type apparatus is displayed. However, similar advantages of the present invention are also obtained in a continuous type apparatus for mass production wherein a pressure difference is provided between each room and the pressure in the discharge region is kept at a prescribed pressure.

Specifically, the surface of the aluminum substrate 24 is subjected to texture treatment and the surface roughness is controlled to be 30 nm. Then, after a chromium ground of 100 nm thickness is formed on the substrate 24 with sputtering, a magnetic layer 23 of 50 nm of a magnetic material Co—Ni is formed on the ground. Then, the magnetic disk of this state is fixed to one of the electrodes in the plasma CVD apparatus for a diamond-like carbon film shown in FIG. 5, and various kinds of gases are introduced from inside or from outside the hollow electrode 31 made of sintered alloy of stainless alloy (SUS 316) so as to form a diamond-like carbon thin film 22. The film is formed after discharge over ten hours and the electrode is in a dirty state. Argon is used as the inert gas, while methane or benzene is used as the hydrocarbon. The pressure ratio is set to be inert gas:hydrocarbon=1:3. The applied voltage is 1500 V and the frequency is 10 kHz.

As to the samples Nos. 14 and 15 according to the present invention, argon is introduced through the electrode 31 and hydrocarbon is introduced outside the electrode 31.

As to Samples Nos. 16 and 17, both inert gas and hydrocarbon are introduced through the electrode 31. As to Samples Nos. 18 and 19, both inert gas and hydrocarbon are introduced outside the electrode 31. As to Samples Nos. 20 and 21, argon is introduced outside the electrode 31 while hydrocarbon is introduced through the electrode 31.

Table 2 compiles the introduction of gas and the kind of gas. Table 2 also compiles the number of contact start stops (CSS) which initiate crushing after a lubricant layer 21 of 2 nm has been formed by dipping and drying $C_5F_{11}(CH_2)_{10}COOH$ dissolved in a solvent.

TABLE 2

| | diamond-like carbon film of magnetic disk | | | |
|---|---|---|---|---|
| Sample No. | gas introduction conditions | | state of electrode | deposition rate | CSS numbers ($\times 10^4$) |
| 14 | argon: methane: | inside outside | not dirty | 1 | 100 |
| 15 | argon: methane: | inside outside | not dirty | 20 | 150 |
| 16 | argon: methane: | inside inside | dirty | 18 | 2 |
| 17 | argon: methane: | inside inside | dirty | 2 | 4 |
| 18 | argon: methane: | outside outside | dirty | 1 | 1 |
| 19 | argon: methane: | outside outside | dirty | 25 | 1 |
| 20 | argon: methane: | outside inside | dirty | 3 | 1 |
| 21 | argon: methane: | outside inside | dirty | 23 | 1 |

NB: "inside" means the gas is introduced inside the electrode 31, while "outside" means that the gas is introduced outside the electrode 31.

As shown in Table 2, in a plasma CVD process of opposition electrodes type, if one of the electrodes 31 is made from sintered alloy to blow out inert gas from the electrode 31, the electrode 31 does not becomes dirty and impurities are not included in the diamond-like carbon film. Thus, the CSS characteristic increases to $1 \times 10^6$ or more. If benzene is used as the hydrocarbon, the dirt of the electrode 31 cannot be prevented in Samples Nos. 16-21 with use of the prior art method, and the CSS number is about $1 \times 10^4 - 4 \times 10^4$.

EMBODIMENT 3

Further, in this embodiment, an amorphous silicon thin film is formed on a glass substrate by using a film-deposition apparatus shown in FIG. 5 to be used for a solar cell.

An amorphous silicon film of 2 $\mu$m is deposited on a glass substrate, and a solar cell is constructed. Then, the conversion efficiency is observed. The material gases are hydrogen and tetrachlorosilane. The inner pressure is set to be 0.1 Torr, and the pressure ratio is set to be hydrogen:tetrachlorosilane =1:3. The frequency used is 13.56 MHz. The other conditions are the same as the film-deposition conditions of the diamond-like carbon film as a protection film of magnetic disk.

The deposition is performed after continuous discharge of ten hours wherein the electrode is liable to become dirty. Samples Nos. 22-25 are prepared at different gas introduction conditions. As to samples No. 22 and 23 with use of the manufacturing method of the present invention, hydrogen is introduced through the electrode 31 while tetrachlorosilane is introduced outside the electrode 31. As to sample No. 24, both gases are introduced through the electrode 31. As to sample No. 25, both gases are introduced outside the electrode 31.

Table 3 compiles the gas introduction, the dirtiness of the electrode and the conversion efficiency of a constructed solar cell.

TABLE 3

Amorphous silicon film of solar cell

| Sample No. | gas introduction conditions | | state of electrode | conversion efficiency (%) |
|---|---|---|---|---|
| 22 | $H_2$: | outside | not dirty | 15 |
|    | $SiCl_4$: | inside | | |
| 23 | $H_2$: | outside | not dirty | 14 |
|    | $SiCl_4$: | inside | | |
| 24 | $H_2$: | outside | dirty | 8 |
|    | $SiCl_4$: | inside | | |
| 25 | $H_2$: | outside | dirty | 7 |
|    | $SiCl_4$: | inside | | |
| 26 | $H_2$: | inside | not dirty | 14 |
|    | $SiH_4$: | outside | | |
| 27 | $H_2$: | inside | dirty | 9 |
|    | $SiH_4$: | inside | | |
| 28 | $H_2$: | outside | dirty | 8 |
|    | $SiH_4$: | outside | | |

NB: "inside" means "inside the electrode", while "outside" means "outside the electrode".

Table 3 shows clearly that if hydrogen gas is introduced inside the hollow sintered alloy electrode 31 of the present invention to blow out hydrogen, the dirtiness of the electrode is not generated so that impurities are not included in the amorphous silicon film. Then, the conversion efficiency as a solar cell is high. On the other hand, if the introduction of gasses are not considered carefully, impurities are included in the film and the conversion efficiency as a solar cell has a limit.

Further, in the cases of samples Nos. 26-28, hydrogen and monosilane are used as the material gas. The inner pressure is set to be 0.1 Torr, and the pressure ratio is set to be hydrogen:monosilane = 1:3. The frequency used is 13.56 MHz. The glass substrate is kept at 300° C. The results are also compiled in Table 3.

Sample No. 26 is manufactured according to a method according to the present invention, wherein hydrogen is introduced inside the electrode 31 while monosilane gas is introduced outside the electrode 31. In this sample, the electrode 31 does not become dirty. On the contrary, in Sample No. 27, both gases are introduced inside the electrode 31, and in sample No. 28, both gases are introduced outside the electrode 31 as in a prior art method.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for forming a film in a plasma CVD apparatus comprising a vacuum chamber, a first electrode provided in the vacuum chamber, the first electrode having narrow holes in an inner wall, and a second electrode provided in the vacuum chamber opposed to the inner wall of the first electrode, the second electrode holding a substrate for CVD deposition, the first and second electrodes defining a plasma discharge region; said method comprising the steps of:
   evacuating the vacuum chamber to a pressure for plasma discharge;
   introducing a non-polymerizable gas through said first electrode;
   introducing a polymerizable gas through an inlet to the plasma discharge region;
   applying an electrical voltage to the first electrode to cause plasma discharge in the plasma discharge region, and;
   forming a carbon film on the substrate.

2. A method according to claim 1, wherein said first electrode is made from a sintered alloy.

3. A method according to claim 1, wherein said first electrode is made from a metal having narrow holes.

4. A method according to claim 1, wherein said polymerizable gas is a hydrocarbon which forms a carbon film having a Vickers hardness of about 3000 and said non-polymerizable gas is an inert gas.

5. A method according to claim 4, wherein said substrate is a magnetic recording medium and said carbon film is a protection film for a magnetic recording medium.

6. A method according to claim 1, wherein said polymerizable gas is a tetrachlorosilane which forms an amorphous silicon film and said non-polymerizable gas is hydrogen.

7. A method for forming a film in a plasma CVD apparatus comprising a vacuum chamber, an insulating discharge tube provided in the vacuum chamber, the discharge tube defining a plasma discharge region together with a substrate to which a film is deposited, and a porous electrode provided in the discharge tube; said method comprising the steps of:
   evacuating the vacuum chamber to a pressure for plasma discharge;
   introducing a non-polymerizable gas through said porous electrode;
   introducing a polymerizable gas in said discharge tube to the plasma discharge region;
   applying an electrical voltage to the porous electrode to cause plasma discharge in the plasma discharge region, and;
   forming a carbon film on the substrate.

8. A method for forming a film with a plasma CVD process according to claim 7, wherein said porous electrode is made from a sintered alloy.

9. A method for forming a film with a plasma CVD process according to claim 7, wherein said porous electrode is made from a metal having openings of 50-500 $\mu m$ in diameter.

10. A method according to claim 7, wherein said polymerizable gas is a hydrocarbon which forms a carbon film having a Vickers hardness of about 3000 and said non-polymerizable gas is an inert gas.

11. A method according to claim 10, wherein said substrate is a magnetic recording medium and said carbon film is a protection film for a magnetic recording medium.

12. A method according to claim 7, wherein said polymerizable gas is a tetrachlorosilane which forms an amorphous silicon film and said non-polymerizable gas is hydrogen.

13. A method for forming a film in a plasma CVD apparatus comprising a vacuum chamber, an insulating discharge tube provided in the vacuum chamber, the discharge tube defining a plasma discharge region together with a substrate to which a film is deposited, the discharge tube having a space between an outer wall and an inner wall having narrow holes, and a porous electrode provided in the discharge tube; said method comprising the steps of:
   evacuating the vacuum chamber to a pressure for plasma discharge;

introducing a non-polymerizable gas in said porous electrode;

introducing the non-polymerizable gas through the space in said discharge tube at the same time as the introduction of the non-polymerizable gas through said discharge tube;

introducing a polymerizable gas in said discharge tube to the plasma discharge region;

applying an electrical voltage to the porous electrode to cause plasma discharge in the plasma discharge region, and;

forming a carbon film on the substrate.

14. A method for forming a film with a plasma CVD process according to claim 13, wherein said porous electrode is made from a sintered alloy.

15. A method for forming a film with a plasma CVD process according to claim 13, wherein said porous electrode is made from a metal having openings of 50-500 $\mu$m in diameter.

16. A method according to claim 15, wherein said polymerizable gas is a hydrocarbon which forms a carbon film having a Vickers hardness of about 3000 and said non-polymerizable gas is an inert gas.

17. A method according to claim 16, wherein said substrate is a magnetic recording medium and said carbon film is a protection film for a magnetic recording medium.

18. A method according to claim 15, wherein said polymerizable gas is a tetrachlorosilane which forms an amorphous silicon film and said non-polymerizable gas is hydrogen.

* * * * *